United States Patent
Iwasaki

(10) Patent No.: US 9,838,010 B2
(45) Date of Patent: Dec. 5, 2017

(54) ELECTRONIC APPARATUS AND IMAGE PICKUP APPARATUS

(71) Applicant: CANON KABUSHIKI KAISHA, Tokyo (JP)

(72) Inventor: Takafumi Iwasaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/264,025

(22) Filed: Sep. 13, 2016

(65) Prior Publication Data
US 2017/0078536 A1 Mar. 16, 2017

(30) Foreign Application Priority Data
Sep. 14, 2015 (JP) ................................. 2015-180670

(51) Int. Cl.
*H04N 5/225* (2006.01)
*H03K 17/968* (2006.01)
*G01D 5/347* (2006.01)

(52) U.S. Cl.
CPC ......... *H03K 17/968* (2013.01); *G01D 5/3473* (2013.01); *H03K 2217/94063* (2013.01)

(58) Field of Classification Search
CPC .. H04N 5/2251; H04N 5/2252; H04N 5/2259; G03B 2217/00; G03B 2217/002; G01D 5/3473; G01D 5/34792; G01D 5/34715; G01D 5/34776
See application file for complete search history.

(56) References Cited

U.S. PATENT DOCUMENTS

| 7,358,865 | B2  | 4/2008  | Igaki et al. |
| 8,565,591 | B2* | 10/2013 | Toyama ................... G02B 7/08 359/825 |
| 8,736,987 | B2* | 5/2014  | Sugita .................... G02B 7/023 359/822 |
| 9,411,123 | B2* | 8/2016  | Torii ....................... G03B 3/02 |
| 2012/0075622 | A1* | 3/2012 | Nagura ................ G01D 5/3473 356/138 |
| 2012/0328277 | A1* | 12/2012 | Nakata .................... G03B 3/10 396/131 |
| 2013/0201389 | A1* | 8/2013 | Ohtani ................. G05B 19/402 348/360 |
| 2013/0286194 | A1* | 10/2013 | Horiguchi ........... G01D 5/3473 348/135 |

(Continued)

FOREIGN PATENT DOCUMENTS

JP    2007-064665 A    3/2007

*Primary Examiner* — Kelly L Jerabek
(74) *Attorney, Agent, or Firm* — Cowan, Liebowitz & Latman, P.C.

(57) ABSTRACT

A digital camera is provided that includes a rotation operation member unit having a circumferential surface, a sheet fixed to the circumferential surface of the rotation operation member unit, and a photo reflector provided at a position facing the sheet that applies light to the sheet and detects the light reflected from the sheet. In the sheet, regions that reflect light to a level at which a photo reflector can detect the reflected light and regions that do not reflect the light are alternately formed. Additionally, a convex portion that is formed in the sheet in the rotation axis direction of the rotation operation member unit, and a concave portion that is formed in the rotation axis direction of the rotation operation member unit are engaged.

11 Claims, 10 Drawing Sheets

(56) References Cited

U.S. PATENT DOCUMENTS

2014/0002717 A1* 1/2014 Noguchi .................. G02B 7/08
348/347
2014/0043526 A1* 2/2014 Noguchi .............. G01D 5/3473
348/360

* cited by examiner

ELECTRONIC APPARATUS AND IMAGE PICKUP APPARATUS

BACKGROUND OF THE INVENTION

Field of the Invention

The present invention relates to an electronic apparatus and an image pickup apparatus.

Description of the Related Art

An electronic apparatus, for example, an image pickup apparatus in which various types of operation members including a push-button style, a sliding style, a turn-style are mounted has been proposed. In this electronic apparatus, as a means that detects the operation of the operation member, various sensors are used. Japanese Patent Application Laid-Open Publication No. 2007-64665 discloses an optical encoder that detects a rotation operation of the rotation operation member by using an optical sensor photo reflector that detects the presence or absence of a target object depending on whether or not light that is reflected after applying light emitted from a light emitting unit to the target object can be received at a receiving unit.

In the optical encoder, a reflecting surface in which surfaces that have a different reflectance are alternately formed is provided in the rotation operation member such that ON-OFF switching input to the photo reflector is executed by the rotation operation of the rotation operation member. The rotation operation of the rotation operation member is an operation in which the ON-OFF switching input to the photo reflector is executed, detecting the rotation of the rotation operation member and a rotation amount thereof is allowed, and then various parameters are changed.

Additionally, there are some rotation operation members in which positions with clicks and positions without clicks are alternately formed each time there is a rotation, the clicks are generated during the rotation operation of the rotation operation member, and setting to a desired value is easily performed. In the rotation operation member having a mechanism that generates clicks, no matter to what position the rotation operation member is rotated, a fixed positional relation between the position of the reflecting surface where the ON-OFF switching input to the photo reflector is executed and the click position must always be maintained. For example, when the rotation of the rotation operation member is stopped at a given click position, with respect to the surfaces of the rotation operation member that have a different reflectance, either one of a surface that always reflects or a surface that does not always reflect is needed. In other words, at a given click position, the output of detection changes depending on the surface at which the photo-reflector detects output, that is, a reflecting surface or a non-reflecting surface.

If timing and the positional relation between the click position and the rotation detection are always fixed, at any click position during the rotation operation, the on-off switching to the photo reflector, that is, detecting the rotation of the rotation operation member, is made possible. Rather than directly forming the reflecting surface on the rotation operation member, pasting a sheet member formed with the reflecting surface on the rotation operation member can reduce the cost.

In the optical encoder disclosed in Japanese Patent Application Laid-Open Publication No. 2007-64665, a sheet member formed with a reflecting surface in which surfaces that have a different reflectance are alternately formed are pasted to the inner surface of the rotation operation member. However, when applying a rotation operation member having a click mechanism, it is necessary to regulate a position of the sheet member formed with the reflecting surface in the inner surface of the rotation operation member. When the sheet member formed with the reflecting surface is pasted and fixed without any positional regulation, during the rotation operation of the rotation operation member, the relation between the click position and the timing of the rotation detection by the rotation operation of the rotation operation member is not fixed. Specifically, the output of detection changes depending on a surface detected by the photo reflector at the click position, that is, depending on a reflecting surface or a non-reflecting surface. Therefore, during the rotation operation, the input does not switch at the timing of the click position, and an advantageous operability cannot be realized.

SUMMARY OF THE INVENTION

The present invention provides an electronic apparatus that can regulate a position of a sheet member formed with a reflecting surface so as to realize the advantageous operability of the rotation operation member without increasing the cost.

An electronic apparatus in an embodiment of the present invention is provided with a rotation operation member having a circumferential surface; a sheet member that is fixed to the circumferential surface of the rotation operation member; and a detection unit provided at a position facing the sheet member and configured to apply light to the sheet member and detect light reflected from the sheet member. In the sheet member, a first region having a first reflectance, a second region having a second reflectance that is lower than the first reflectance, and a convex portion are formed; in the rotation operation member, a concave portion with which the convex portion can be engaged is formed; and, in the sheet member, the convex portion engages with the concave portion, and is fixed to the circumferential surface such that the first region and the second region are alternately arranged in the circumferential direction of the circumferential surface.

Further features of the present invention will become apparent from the following description of exemplary embodiments (with reference to the attached drawings).

DESCRIPTION OF THE EMBODIMENTS

First Embodiment

Figure 1:
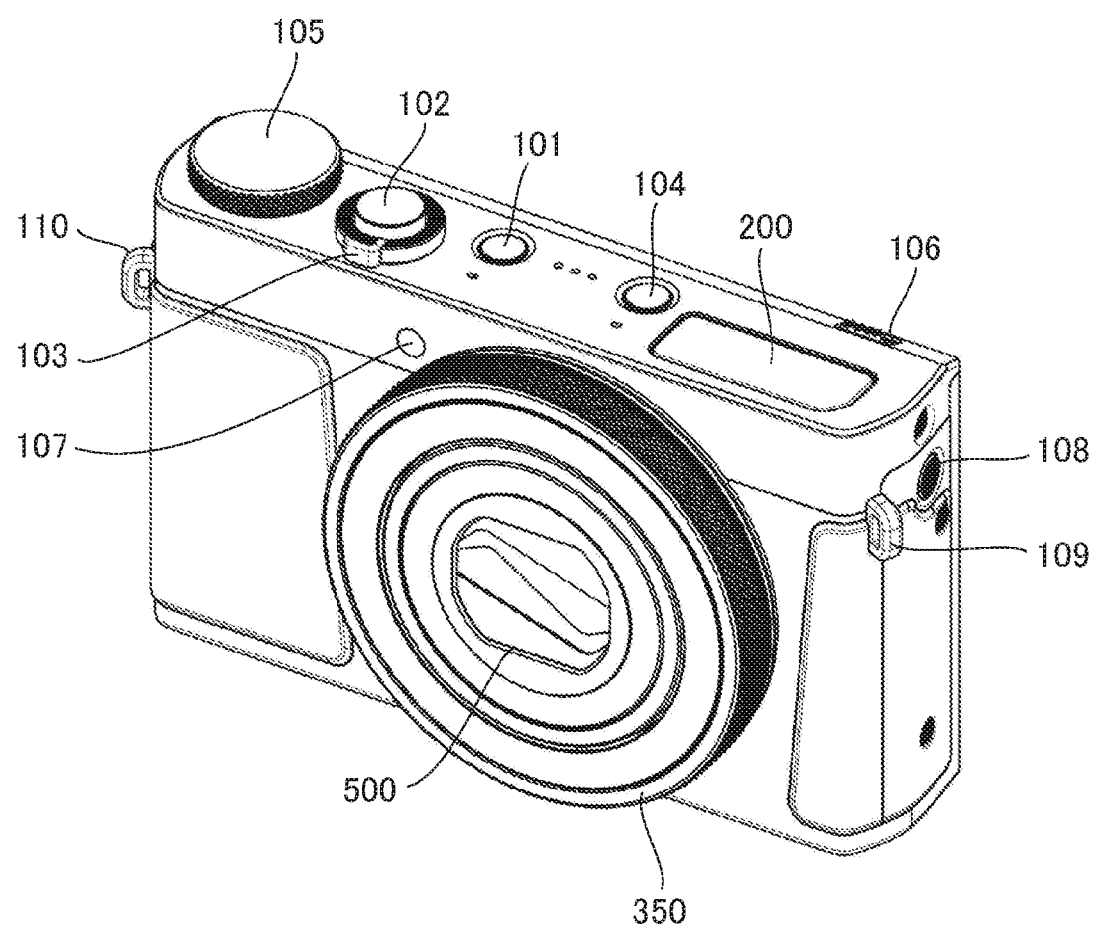
FIG. 1 is an external perspective view of an electronic apparatus of the present embodiment.

FIG. 1 is an external perspective view of an electronic apparatus of the present embodiment. The electronic apparatus shown in FIG. 1 is an image pickup apparatus, which is a digital camera in this example. Reference numeral 101 in FIG. 1 is a power supply button having an ON/OFF function of a power supply of the digital camera. Reference numeral 102 is a release button that provides instructions for shooting preparation and shooting start. Reference numeral 103 is a zoom lever. In an optical variable magnification function or a digital variable magnification function, the zoom lever 103 is used to perform the adjustment operation for the magnification.

The zoom lever 103 is rotationally movable to a predetermined angle with respect to the center of the release button 102. Reference numeral 104 is a playback button for reproducing and displaying an image that has been captured. Reference numeral 105 is a mode dial that can switch between a variety of shooting modes. Reference numeral 107 is a window that protects an AF auxiliary light LED. Reference numerals 109 and 110 are strap attachment portions through which a strap cord is inserted. Reference numeral 200 is a flash emission device. Additionally, reference numeral 500 is a collapsible barrel lens.

When a release lever 106 of the flash emission device 200 is moved in the lateral direction, a flash unit pops up, and the device 200 transitions to a flash-enabled state. In the state shown in FIG. 1, the flash emission device 200 is accommodated. On the outer circumference side of the collapsible barrel lens 500, a rotation operation member unit 350 having a rotatory operation member (rotation operation member) that is operated when setting values of various parameters are changed is provided.

Figure 2:
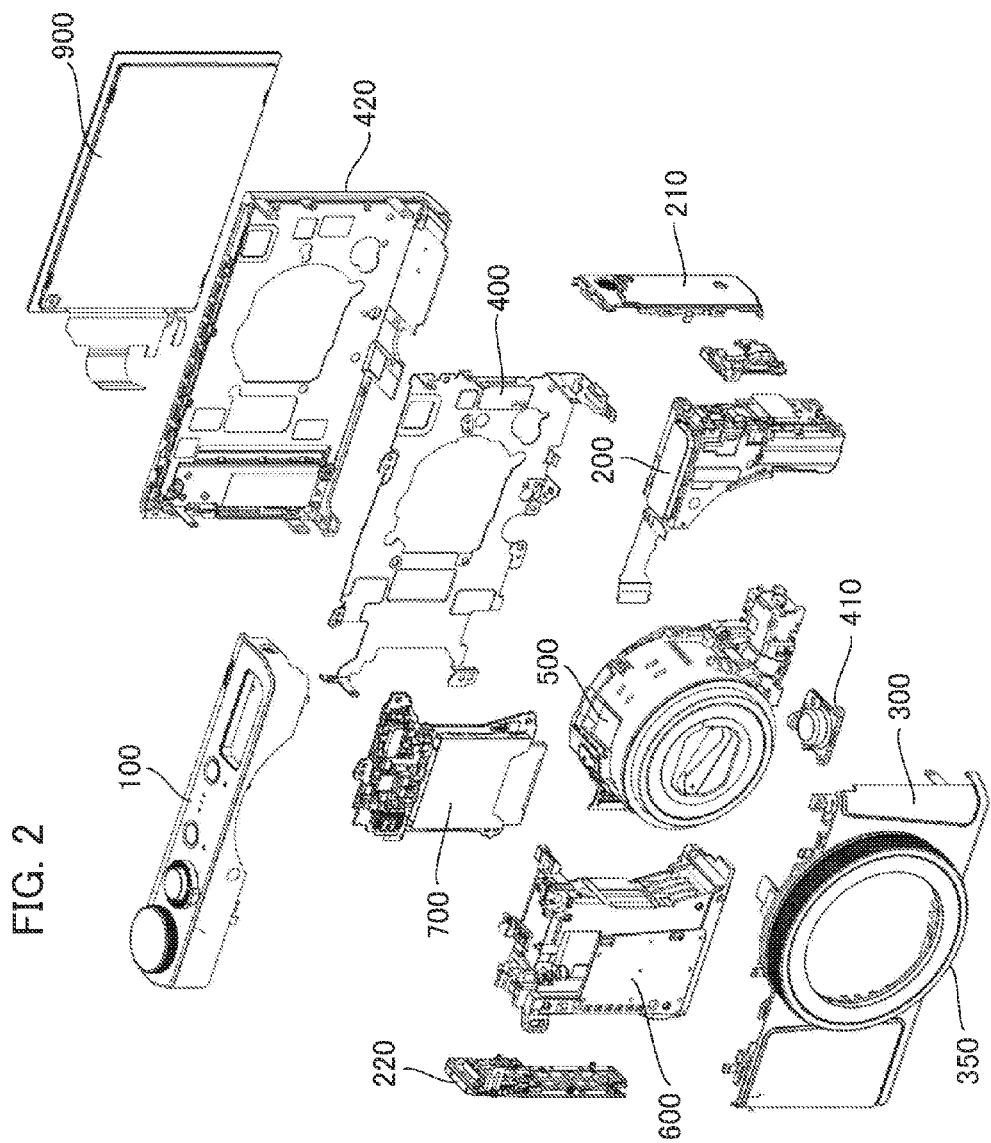
FIG. 2 is an example of an exploded perspective view of the electronic apparatus.

FIG. 2 is an example of an exploded perspective view of the electronic apparatus. Reference numeral 100 is a top cover unit. Reference numeral 200 is the flash emission unit. Reference numeral 300 is a front cover unit including the rotation operation member unit 350. Reference numeral 410 is a tripod threaded unit to which a tripod is attached. The collapsible barrel lens 500 is held by a metal chassis 400. Reference numeral 220 is a left face cover. Reference numeral 210 is a right face cover. Reference numeral 420 is a rear cover unit that includes a rear operation button (not illustrated). Reference numeral 900 is a liquid crystal display unit.

Figure 3:
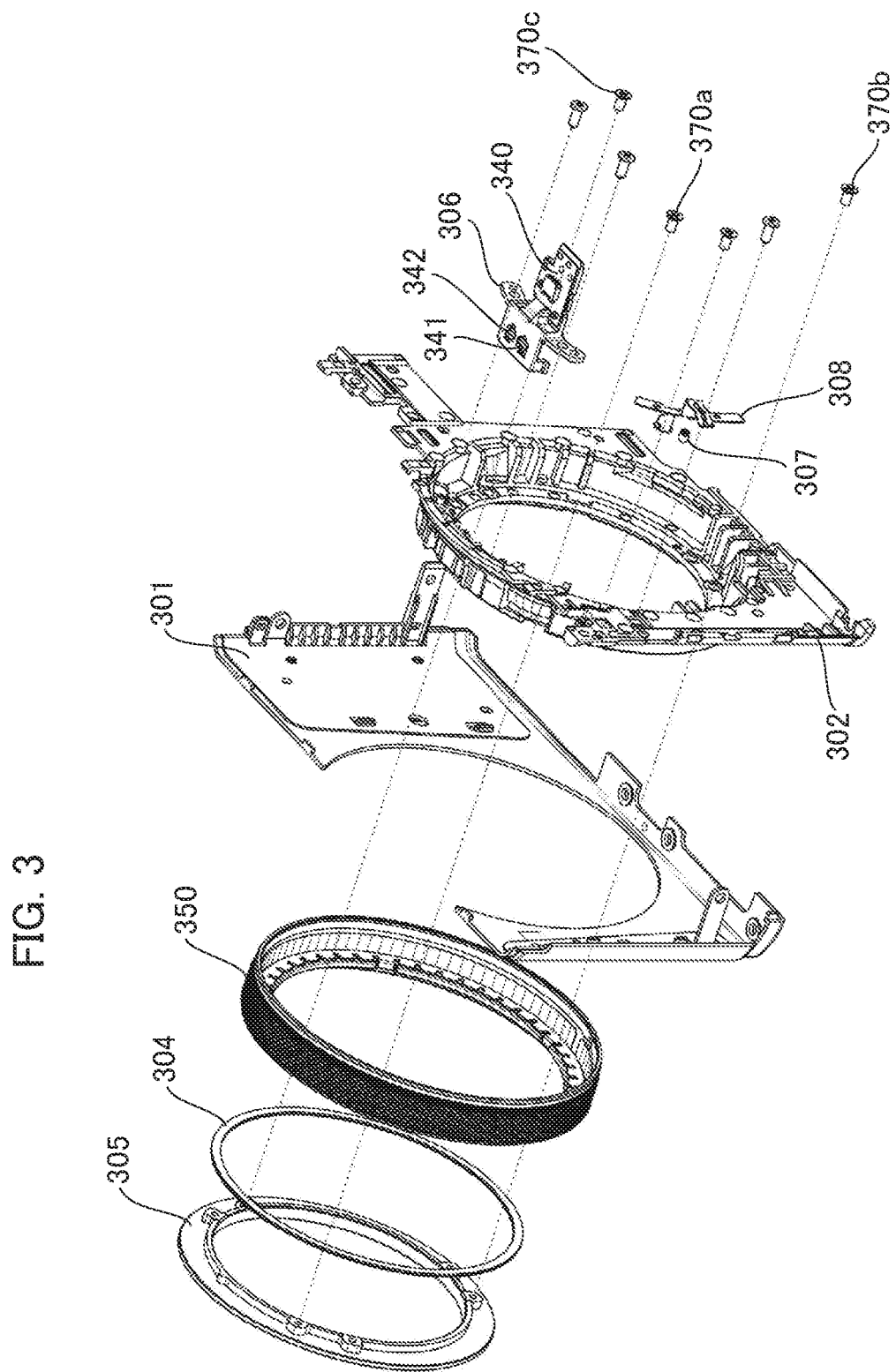
FIG. 3 is an exploded perspective view of a front cover unit.

FIG. 3 is an exploded perspective view of the front cover unit. Reference numeral 301 is a front cover and is normally formed of an aluminum plate material. The rotation operation member unit 350 is rotatably interposed and held by a fixing member 305, which is an external part at the front side, and a reference numeral 302, which is an inner structural component. The rotation operation member unit 350 is rotatably operatable, and a sliding sheet 304 is located between the rotation operation member unit 350 and the fixing member 305 in order to improve the slidability in the rotation and to suppress rattling of the rotation operation member in the rotation axis direction. Additionally, photo-reflectors 341 and 342 described below are mounted on a flexible wiring substrate 340. A holding member 306 holds the substrate 340 and fixes it to the inner structural component 302. A steel ball 307 is a part of a click mechanism described below.

Figure 4A:
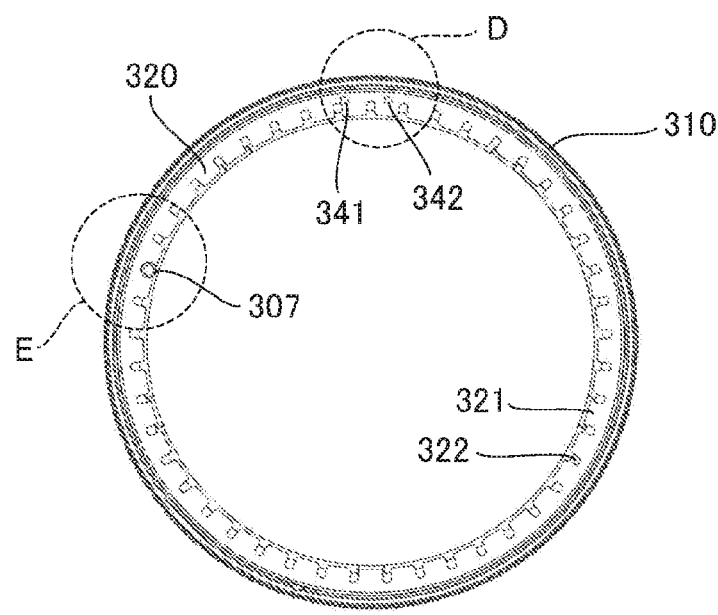
FIGS. 4A and 4B are rear views of a rotation operation member unit and a front cover unit.
Figure 4B:
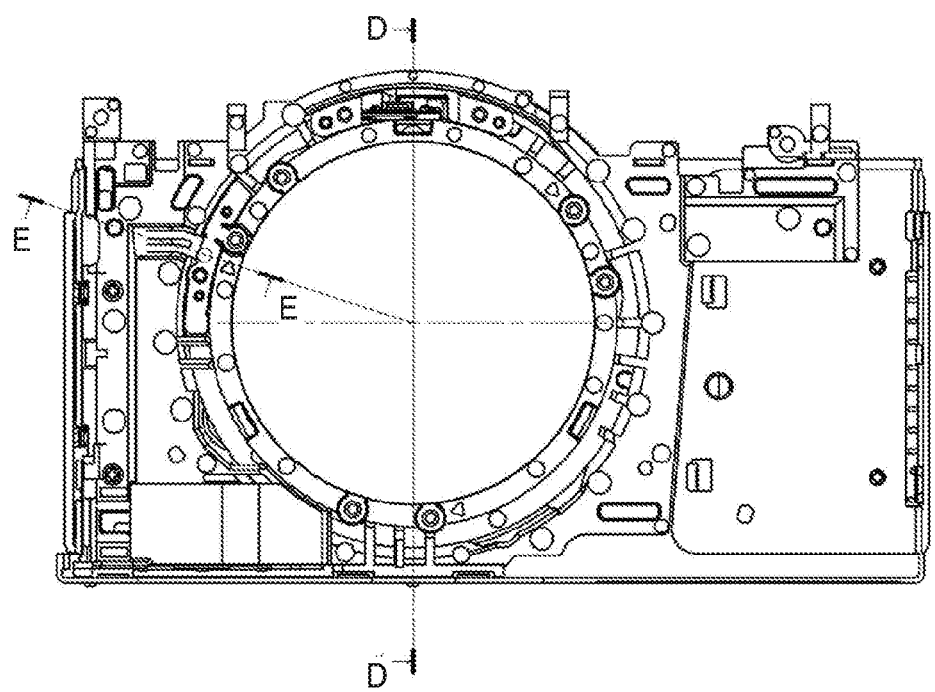

FIGS. 4A and 4B are rear views of the rotation operation member unit and the front cover unit. FIG. 4A shows a rear view of the rotation operation member unit 350. FIG. 4B shows a rear view of the front cover unit 300. In FIG. 4A, the positional relation between the steel ball 307 and the photo-reflectors 341 and 342 is shown. The rotation operation member unit 350 is provided with a rotation operation member 310 and an annular plate member 320. The annular plate member 320 functions as a click sensation generating unit that generates a click sensation when rotation operation of the rotation operation member 310 is performed. Additionally, in the present embodiment, the photo-reflectors 341 and 342 are arranged in part "D" in FIG. 4A, and the steel ball 307 is located in part "E".

Figure 5:
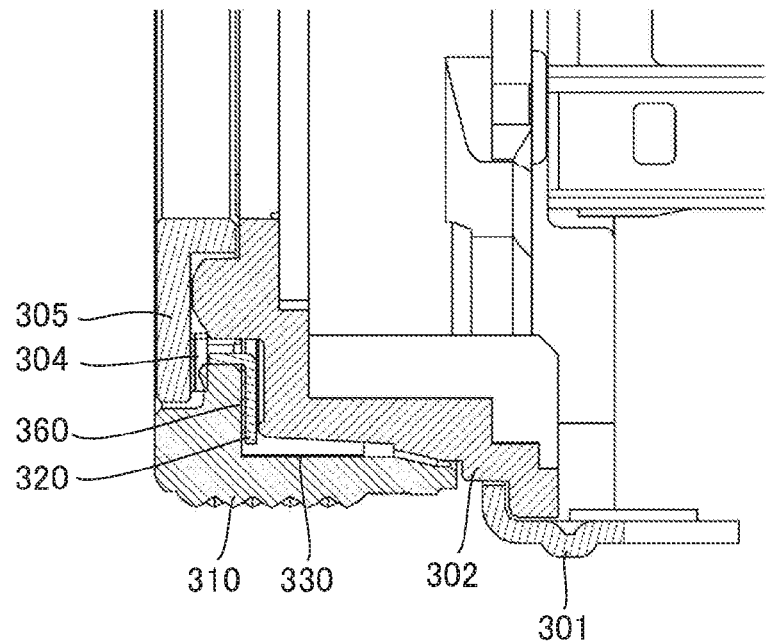
FIG. 5 is a lower detailed view of a cross-section D-D in FIG. 4B.

FIG. 5 is a lower detailed view of a cross-section along D-D in FIG. 4B. The rotation operation member 310 is rotatably interposed by the fixing member 305 and the inner structural component 302. Additionally, the rotation operation member 310 is formed by cutting an aluminum material, the outer circumference thereof is finished in an uneven state, and the surface thereof is finished in a rough surface by blasting processing. As a result for this processing, a finger does not easily slip, and the operability is enhanced. The fixing member 305 and the inner structural component 302 are fixed by three screws 370a, 370b, and 370c shown in FIG. 3.

Figure 6:
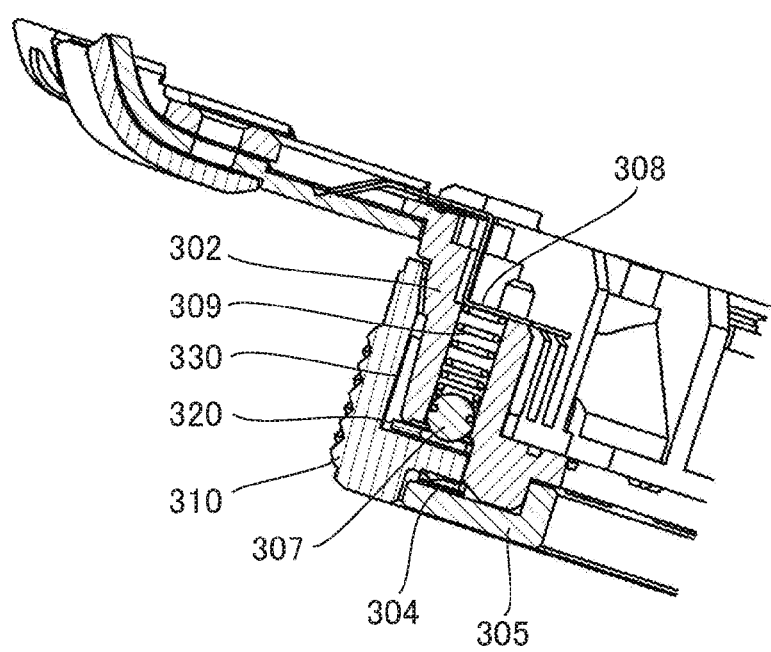
FIG. 6 illustrates a structure of a click mechanism.
Figure 7:
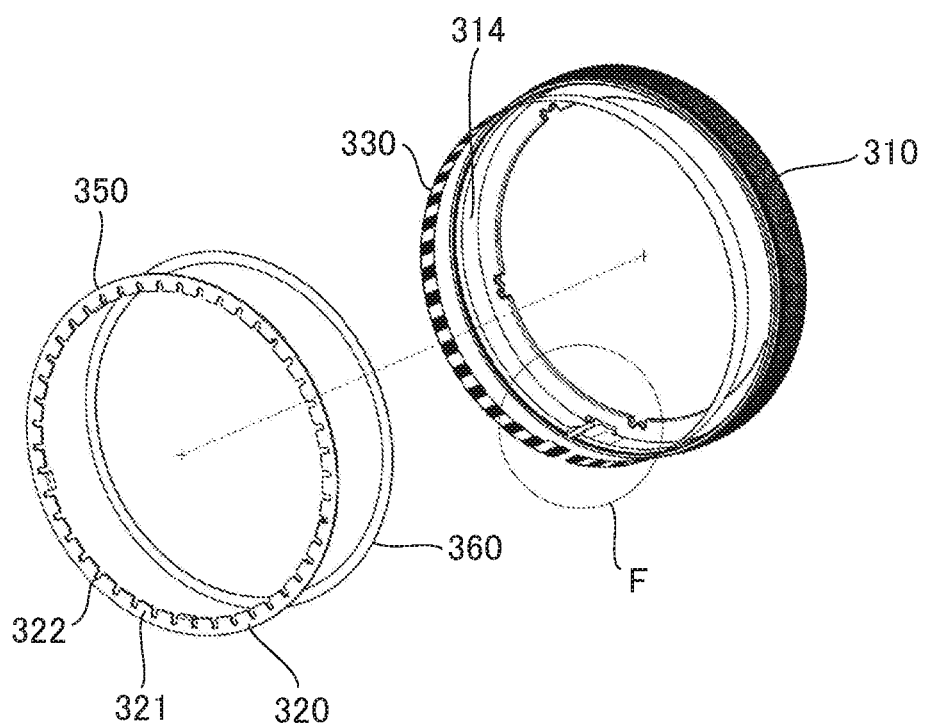
FIG. 7 is an exploded perspective view of the rotation operation member unit.

FIG. 6 is a diagram showing a cross-section along E-E in FIG. 4B. FIG. 6 shows a structure of the click mechanism. FIG. 7 is an exploded perspective view of the rotation operation member unit. On the circumferential surface 314 of the rotation operation member 310, a sheet 330 is pasted and fixed. The sheet 330 is for detecting the rotation of the rotation operation member 310, alternately formed with regions in which light that is reflected from the photo reflector reflects to a detectable level and regions in which the light that is reflected from the photo reflector does not reflect. Additionally, the annular plate member 320, which is a part of the click mechanism, is positionally regulated and fixed to the rotation operation member 310 via a double-sided tape 360. In the annular plate member 320, a plurality of cutout portions 322 and convex portions 321 are formed alternately.

A click mechanism shown in FIG. 6 includes the annular plate member 320 fixed to the rotation operation member 310, the steel ball 307 that is in contact with the annular plate member 320, an urging spring 309 that urges the steel ball 307 toward the annular plate member 320, and a plate member 308 that prevents the falling off of the urging spring 309. When the rotation operation member 310 is rotated, the steel ball 307, which is a spherical member, engages with the cutout portion 322 of the annular plate member 320 with an urging force of the urging spring 309, escapes from the cutout portion 322 of the annular plate member 320 and is no longer engaged, and passes over the convex portion 321 of the annular plate member 320. The steel ball 307 alternately repeats this operation when the rotation operation member 310 is rotated. That is, by the rotation operation of the rotation operation member 310, a state in which the cutout portion 322 and the steel ball 307 are engaged and a state in which they are not engaged are repeated, and click sensations are consequently generated. When the steel ball 307 engages with the cutout portion 322 of the annular plate member 320, the rotation operation member 310 transitions to a state in which the rotation stops. The position of the rotation operation member 310 in this state, in other words, the position of the rotation operation member unit 350, is referred to as a "click position" in the present embodiment. The click positions are present by the number of cut-out portions 322 of the annular plate member 320.

Figure 8A:
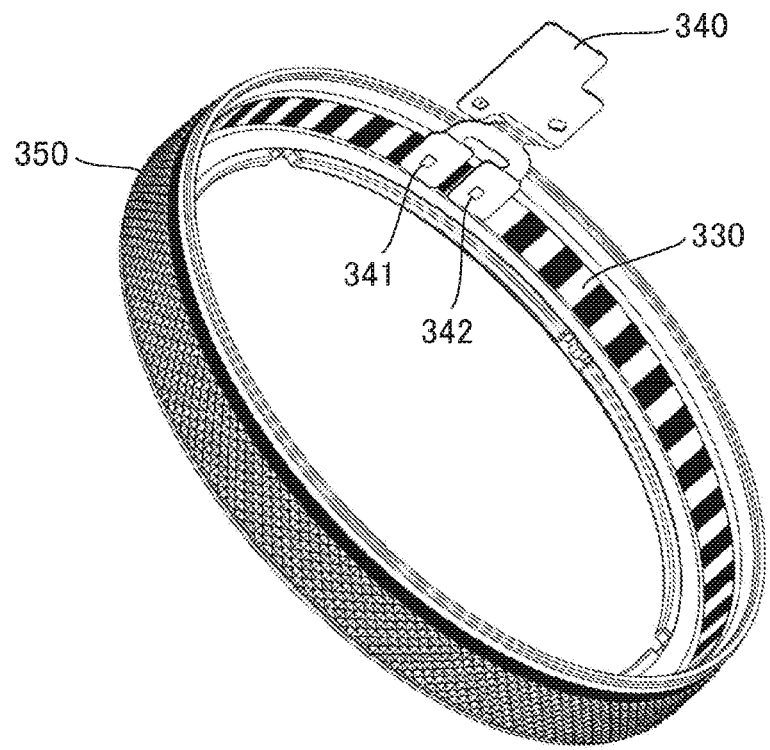
FIGS. 8A and 8B explain the inner side of a flexible wiring substrate.
Figure 8B:
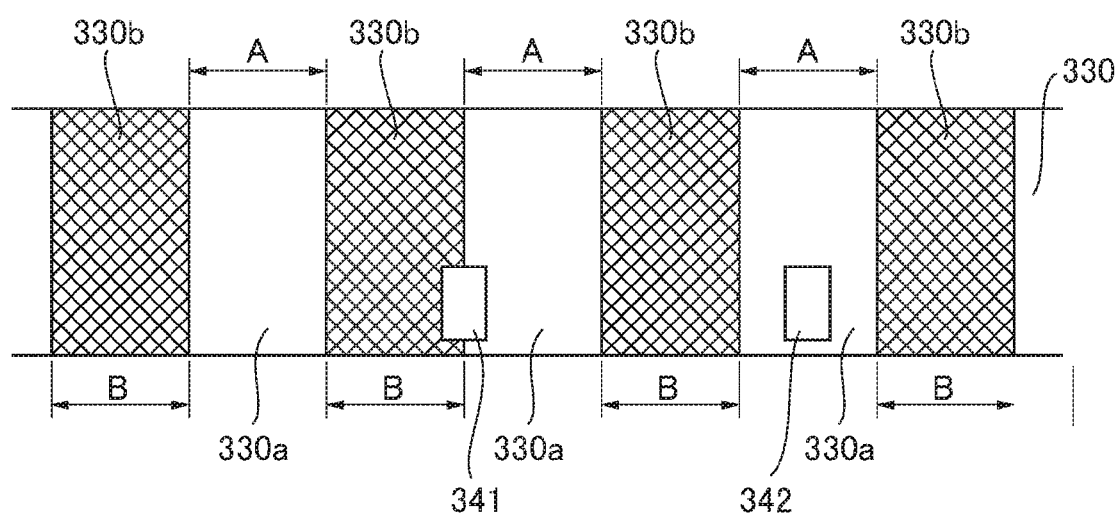

FIG. 8A and FIG. 8B are diagrams that explain the inner side of the flexible wiring substrate. FIG. 8A shows the flexible wiring substrate mounted with the rotation operation member unit and the photo-reflectors in FIG. 4A, which is seen from the inner side. FIG. 8B shows a partial cross-section in FIG. 8A. As shown in FIG. 8A, the flexible wiring substrate 340 mounted with the photo-reflectors 341 and 342 is located on the inner circumferential side of the rotation operation member 310, and the photo-reflectors 341 and 342 themselves are arranged so as to face the outer circumference. In the inner circumference of the rotation operation member 310, a sheet (sheet member) 330 is pasted along the circumference. The sheet 330 has alternately formed therein regions where the light reflected from the photo-reflector reflects to a detectable level and regions that are non-reflecting regions.

As shown in FIG. 8B, in the sheet 330, regions 330a, which are reflecting regions, having width A at nearly equal intervals in the circumferential direction, and regions 330b which are non-reflecting regions, having width B at nearly equal intervals are formed. The width A and the width B are set to have approximately equal length. In the present embodiment, regarding the sheet 330, the white region 330a represents a reflecting region, and the black region 330b represents a non-reflecting region. Additionally, in the present embodiment, the color of the white region 330a is provided by the color of the material of the sheet 330. Additionally, the black region 330b is configured by performing printing on the white region 330a of the sheet 330. The white region 330a is an example of a first region having a first reflectance. The black region 330b is an example of a second region having a second reflectance that is lower than the first reflectance.

In order to detect the rotation of the rotation operation member unit 350 by the photo-reflectors 341 and 342, it is necessary to alternately provide regions, which are reflecting regions, and regions, which are non-reflecting regions, on the inner circumferential surface of the rotation operation member 310 that faces the photo-reflectors 341 and 342. The white region 330a, which is a reflecting region, can reflect light emitted from the light emitting unit of the photo-reflectors 341 and 342 to a level that is detectable by the light receiving units of the photo-reflectors 341 and 342. Additionally, the black region 330b, which is a non-reflecting region, cannot reflect the light emitted from the light emitting unit of the photo-reflectors 341 and 342 to the level that is detectable by the light receiving units of the photo reflectors 341 and 342. Accordingly, with the rotation of the rotation operation member 310, it is possible to alternately cause light-receiving states and non-light-receiving states at the light receiving unit of the photo-reflectors 341 and 342, and possible to transmit waveform signals to a signal processing circuit (not illustrated).

Next, a description will be given of a method of detecting rotation when the rotation operation of the rotation operation member unit 350 is performed. As shown in FIG. 8B, regarding the pitch of arrangement of the two photo-reflectors, when the photo-reflector 342, which is one of the photo reflectors, is located at the approximate center of the white region 330a, and the photo-reflector 341, which is the other one of the photo reflectors, is located at approximate boundary of the white region 330a and the black region 330b. This arrangement makes it possible to maximize a phase difference between the signal waveforms that are output from the two photo-reflectors 341 and 342. The phase difference between the signal waveforms is required in order to detect the rotational direction. Due to the presence of the phase difference, when the photo reflector 342, which is one of the photo reflectors, receives light, a case in which the light is received by the photo reflector 341, which is the other one of the photo reflectors, or a case in which the light is not received thereby, occurs. This difference enables determining which direction the rotation operation member unit 350 rotates by a signal processing circuit (not illustrated).

Figure 9:
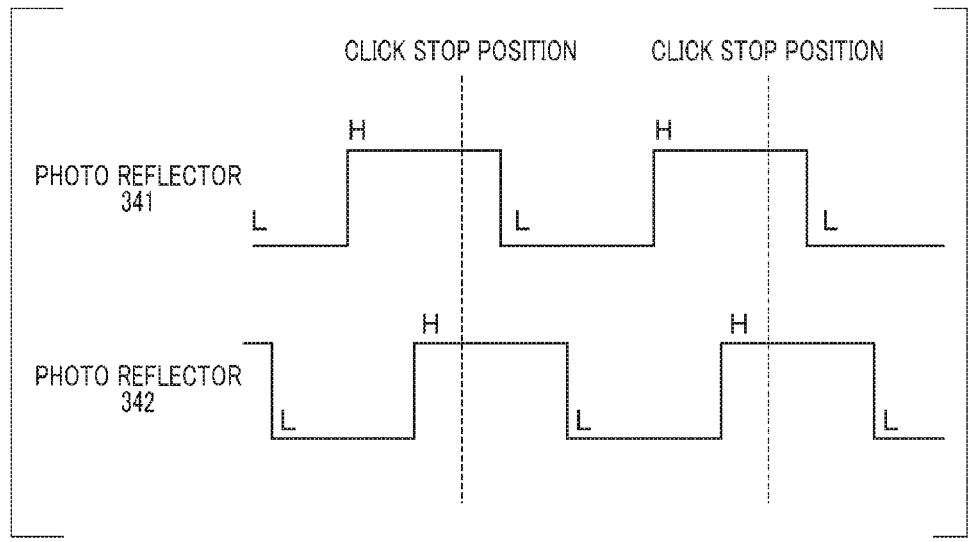
FIG. 9 illustrates signal waveforms output from photo-reflectors.

FIG. 9 illustrates signal waveforms that are output from the two photo-reflectors when the rotation operation of the rotation operation member unit is performed. The waveforms shown in FIG. 9 are waveforms that occur when the rotation operation of the rotation operation member unit 350 is performed in the clockwise direction. The range represented by the waveform "H" shows a light-receiving state of the photo-reflectors 341 and 342. The range represented by the waveform "L" shows a non-light-receiving state. As shown in FIG. 9, in the waveforms output from the two photo-reflectors 341 and 342, a phase difference of nearly half phase is generated.

In the present embodiment, the rotation operation of the rotation operation member unit 350 is performed, wherein the rotation operation member unit 350 rotates in the clockwise direction if the photo-reflector 342, serving as a second detection unit, does not receive light while the photo-reflector 341, serving as a first detection unit, receives light, and the rotation operation member unit 350 rotates in the counter-clockwise direction if the photo-reflector 342, serving as a second detection unit, receives light while the photo-reflector 341, serving as a first detection unit, receives light. In a case where the phase difference between the signal waveforms of the two photo-reflectors 341 and 342 is not present, the signal waveforms of the two photo-reflectors 341 and 342 are the same no matter what direction the rotation operation member unit 350 is rotated, and accordingly the rotation direction cannot be detected. Additionally, when the phase difference between the signal waveforms of the two photo-reflectors 341 and 342 is small, a variation occurs in the presence or absence of the phase difference, and it causes the erroneous detection in the rotational direction.

Additionally, the rotation amount of the rotation operation member unit 350 does not depend on the rotation direction, and a signal processing circuit (not illustrated) determines that the rotation operation member unit 350 rotates by one pitch when the photo reflector 341 is switched from "L" to "H". As described above, on the inner circumference of the rotation operation member unit 350, the white regions 330a, which are reflecting regions, and the black regions 330b, which are non-reflecting regions, are alternately provided over the entire circumference with the same pitch width. That is, the rotation operation member unit 350 can detect the rotation each time rotation occurs by one pitch.

In the present embodiment, the arrangement relation between the photo-reflectors 341 and 342 and the sheet 330 at the click position is in the positional relation shown in FIG. 9. That is, when the rotation operation member unit 350 is in the click position and the rotation stops, the arrangement relation among the photo-reflectors 341 and 342, and the sheet 330 is set to be in a range in which each output waveform of the photo-reflectors 341 and 342 shows "H". Because the number of click positions that are present is the same as that of the cutout portion 322 of the annular plate member 320, each time the rotation operation member unit 350 is in the click position, the arrangement relation between the photo-reflectors 341 and 342 and the sheet 330 is set so as to be the relation shown in FIG. 8B. That is, the photo-reflectors and the sheet 330 are arranged such that, each time the rotation operation member unit 350 is in the click position, the photo-reflector 342 is located in the white region 330a and the photo-reflector 341 is located at the boundary of the white region 330a and the black region 330b.

Figure 10:
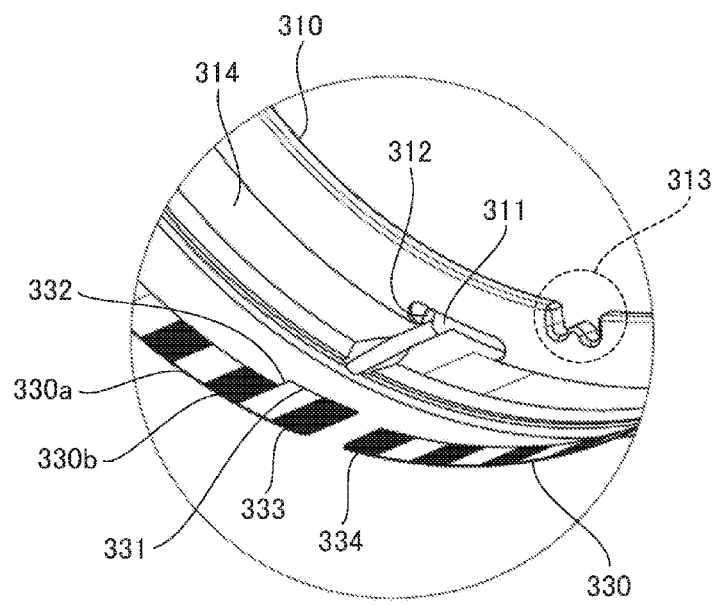
FIG. 10 is a detailed view of part "F" in FIG. 7.

FIG. 10 is a detailed drawing of part "F" in FIG. 7. Referring to FIG. 10, a description will be given of the pasting and fixing of the sheet 330 to the circumferential surface 314 of the rotation operation member 310. In the sheet 330, the convex portion 331 is formed in the rotation axis direction of the rotation operation member 310. Additionally, in the rotation operation member 310, the concave portion 311 is formed in the rotation axis direction from the circumferential surface 314. The concave portion 311 is formed so as to be engageable with the convex portion 331. While engaging the end surface 332 in the circumferential direction of the convex portion 331 with the side surface 312 in the circumferential direction of the concave portion 311 formed in the rotation operation member 310, the sheet 330 is pasted and fixed to the circumferential surface 314 of the rotation operation member 310. That is, the sheet 330 is fixed to the rotation operation member 310 such that the convex portion 331 engages with the concave portion 311, and the white regions 330a and the black regions 330b are arranged alternately in the circumferential direction of the circumferential surface 314.

Because the end surface 332 in the circumferential direction of the convex portion 331 is always in contact with the side surface 312 in the circumferential direction of the concave portion 311, the sheet 330 is positionally regulated by the rotation operation member 310. The sheet 330 has a first end 333 and a second end 334, which is the end opposite to the first end, in the circumferential direction. Additionally, the convex portion 331 of the sheet 330 is formed near the first end 333.

When the sheet 330 is pasted and fixed to the rotation operation member 310, a place where the sheet 330 is first fixed is set to the convex portion 331, and thus the direction in which the sheet 330 is pasted can be limited to one direction. While the end 332 of the convex portion 331 of the sheet 330 and the end 312 of the concave portion 311 of the rotation operation member 310 are rotated in the direction in which they contact each other, the sheet 330 is pasted and fixed. Accordingly, it is possible to paste the sheet 330 to the end 334 always toward the same direction, and consequently, the assembling property improves.

Figure 11:
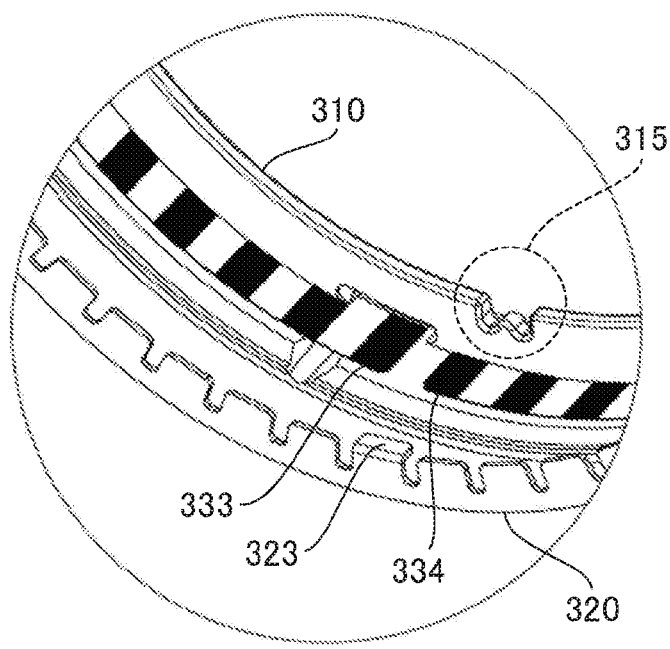
FIG. 11 is a detailed view of part "F" in FIG. 7.

FIG. 11 is a detailed view of part "F" in FIG. 7. Referring to FIG. 11, a description will be given of the positional regulation of the annular plate member 320, which is a part of the click mechanism, and the rotation operation member 310 in the circumferential direction. In FIG. 11, in the rotation operation member 310, the cutout portion 315 is formed in the circumferential direction. Additionally, in the annular plate member 320, a bending portion 323 toward the rotational axis direction, having a width that is the same as that of the cutout portion 315, is formed. When the annular plate member 320 is fixed to the rotation operation member 310, the bending portion 323 and the cutout portion 315 fit together, a position regulating unit is configured, and the annular plate member 320 and the rotation operation member 310 are positionally regulated.

As described above, the sheet 330 and the annular plate member 320 always have the same positional relation via the rotation operation member 310. Because the positional relation between the sheet 330 and the annular plate member 320 is always the same relation, at the click position of the rotation operation member unit 350, the arrangement relation between the photo-reflectors 341 and 342 and the sheet 330 are that shown in FIG. 8B.

Figure 12:
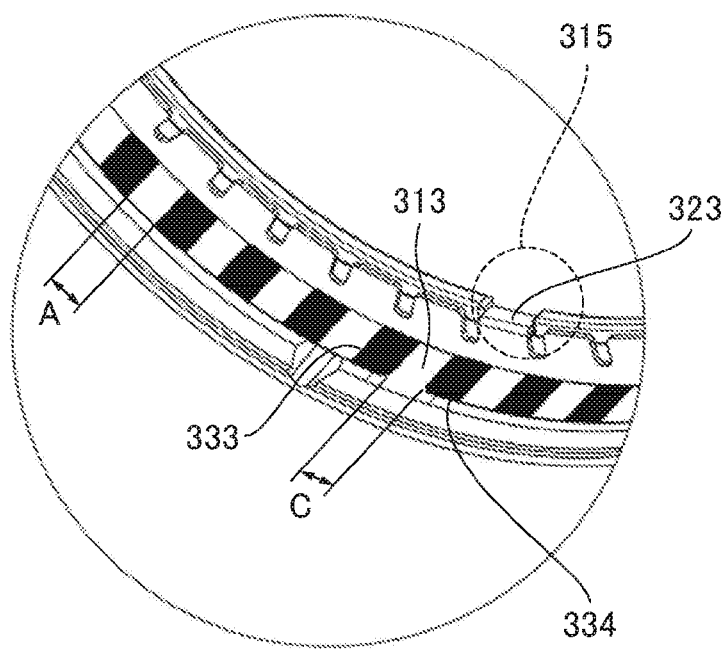
FIG. 12 is a detailed view of part "F" in FIG. 7.

FIG. 12 is a detailed view of part "F" in FIG. 7. In FIG. 12, the area near the end of the sheet 330 is shown. The first end 333 and the second end 334 of the sheet 330 are each configured by black regions, which are non-reflecting regions, with a gap of width "C". Furthermore, the width "A" and the width "C" of the white regions, which are reflecting regions, are configured with the same width. When the sheet 330 is pasted and fixed to the entire circumference of the inner surface of the rotation operation member 310, there are cases in which the ends of the sheet overlap depending on the assembly of the pasting of the sheet 330. In this case, there is a probability that the rotation detection of the rotation operation member 310 cannot be performed. Thus, in the present embodiment, the ends 333 and 334 of the sheet 330 are both configured by the black regions, which are non-reflecting regions, and the sheet is pasted and fixed in a state in which a gap with a width that is the same as the width "C" of the white region is provided. The place where the gap of the width "C" is provided becomes a state in which the inner surface of the rotation operation member 310 is exposed.

A process that generates a metallic oxide film is performed on the rotation operation member 310. In this example, the rotation operation member 310 is formed by using aluminum as a material, and alumite processing is performed in order to prevent corrosion and provide decoration. Removing a part of this alumite processing with a laser light or the like makes it possible to expose the aluminum base. The aluminum base has a reflectance that is the same as that of the white regions 330a that are reflected. In the present embodiment, the aluminum base is exposed to an inner surface 313, which is a part of the rotation operation member 310 in FIG. 12, and as a result, regions that are reflected, which is equivalent to the white region 330a, which is a reflected region, is configured. That is, in the inner surface 313 that is exposed, the surface is processed such that the light reflected from the photo-reflector is reflected to a detectable level. The width "A" part and the width "C" part of the white region 330a that are reflected are configured with the same width, the width "C" part has a reflectance that is the same as the white regions 330a that are reflected on the sheet 330, so that no influence occurs in the rotation detection of the rotation operation member 310. If the difference in reflectance between the white region 330a and the inner surface 313 that is exposed is smaller than that between the white region 330a and the black region 330b, the photo-reflectors 341 and 342 can detect the inner surface 313 that is exposed in a way similar to the white region 330a.

Additionally, in the present embodiment, in a state in which the sheet 330 is pasted and fixed to the rotation operation member 310, the end 334 of the sheet 330 and the cutout portion 315 formed on the rotation operation member 310 are arranged substantially near each other. The sheet 330 is positionally regulated at the beginning of pasting, and the position is determined with a high accuracy. However, while pasting the entire circumference, the positioning deviation in assembly of pasting increases, and at the end 334 of the sheet 330, which is the final fixing point, there is a probability that the position deviates slightly. Accordingly, the cutout portion 315 that configures the position regulating unit that positionally regulates the rotation operation member 310 and the annular plate member 320, and the end 334 are arranged substantially near each other, and thus the positional relation with little positioning deviation of the annular plate member 320 is provided. Consequently, the positional accuracy between the annular plate member 320 and the end 334 increases.

Second Embodiment

Figure 13:
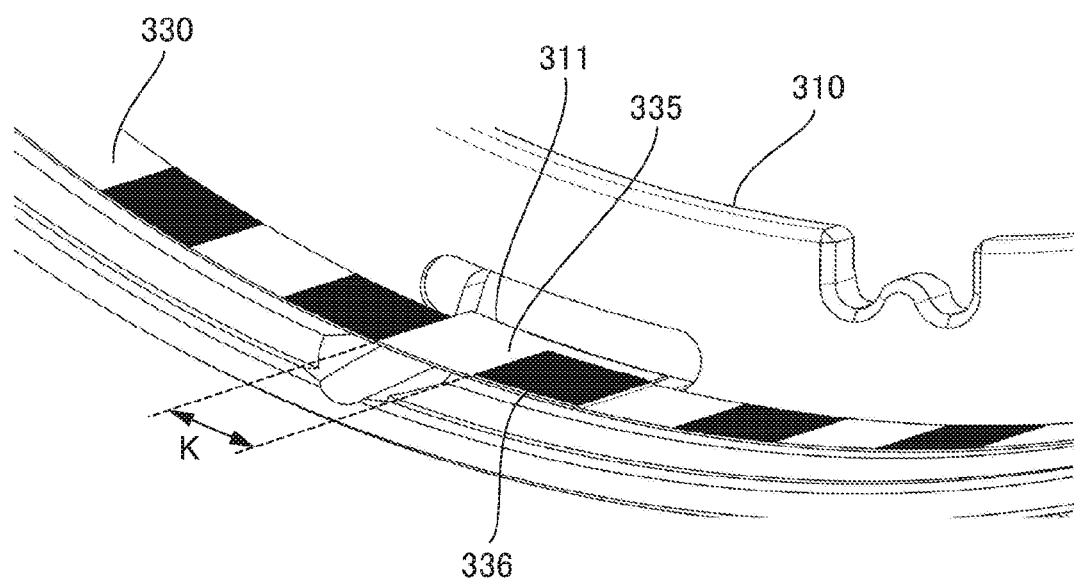
FIG. 13 illustrates pasting and fixing of the sheet to the inner surface of the rotation operation member.

Next, a second embodiment will be described. The same reference numerals are used for the same members as those in the first embodiment, and the description that overlaps will be omitted. FIG. 13 is a diagram that explains the pasting and fixing of the sheet on the circumferential surface of the rotation operation member in the second embodiment.

The end 335 (first end), including the convex portion 331 in the rotation axis direction of the sheet 330, is configured by the white regions 330a, which are reflecting regions. Additionally, the second end 336 of the sheet 330 is configured by the black regions 330b, which are non-reflecting regions. As shown in FIG. 13, the end 335, including the convex portion 331 in the rotation axis direction of the sheet 330, overlaps with the end 336 of the sheet 330 with a gap of width "K" and is pasted and fixed. The width "K" is set to a width that is the same as the width "A" of the white region 330a (FIG. 10), which is a portion different from the end 335 in the sheet 330, so that no influence occurs on the rotation detection. That is, in a state in which the sheet 330 is fixed to the inner surface of the rotation operation member, the end 336 is fixed to overlap with the end 335 such that the white region remains by the width "A" in the end 335.

According to the configuration of the second embodiment, it is not necessary to expose the base by removing a part of aluminum of the rotation operation member 310 on which the alumite processing has been performed by using a laser light and the like. Subsequently, a process that removes the aluminum by the alumite processing is eliminated, and thus the rotation operation member 310 can be manufactured at a low cost.

According to the above-described configurations of the first embodiment and the second embodiment, in the rotation operation member unit having a click mechanism during rotation operation, a fixed relation can be always provided to the timing of a click and the rotation detection during rotation of the rotation operation member unit without increasing the cost. As described above, the preferred embodiments of the present invention were described, and the present invention is not limited to these embodiments, and various variations and modifications may be made within the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-180670, filed Sep. 14, 2015, which is hereby incorporated by reference wherein in its entirety.

What is claimed is:

1. An electronic apparatus comprising:
   a rotation operation member having a circumferential surface;
   a sheet member that is fixed to the circumferential surface of the rotation operation member; and
   a detection unit provided at a position facing the sheet member and configured to apply light to the sheet member and detect light reflected from the sheet member,
   wherein, in the sheet member, a first region having a first reflectance, a second region having a second reflectance that is lower than the first reflectance, and a convex portion are formed,
   wherein, in the rotation operation member, a concave portion with which the convex portion can be engaged is formed, and
   wherein, in the sheet member, the convex portion engages with the concave portion, and the sheet member is fixed to the circumferential surface such that the first region and the second region are alternately arranged in the circumferential direction of the circumferential surface.

2. The electronic apparatus according to claim 1, wherein the sheet member is fixed to the circumferential surface such that an end in the circumferential direction of the convex portion and an end in the circumferential direction of the concave portion are engaged.

3. The electronic apparatus in according to claim 1, wherein, in the rotation operation member, a click sensation generating unit is formed that generates a click sensation when the rotation operation of the rotation operation member is performed.

4. The electronic apparatus according to claim 3,
   wherein, in the click sensation generating unit, a plurality of cutout portions are formed in the circumferential direction, and a spherical member is in contact therewith, and
   wherein, when the rotation operation of the rotation operation member is performed, a state in which the spherical member and the cutout portion are engaged and a state in which they are not engaged are repeated, and the click sensation is generated.

5. The electronic apparatus according to claim 4, further comprising first and second detection units,
   wherein the first and second detection units and the sheet member are arranged such that, each time the spherical member and the cutout portion are in an engaged state, the second detection unit is located at the first region and the first detection unit is located at the boundary of the first region and the second region.

6. The electronic apparatus according to claim 3,
   wherein the click sensation generating unit, which generates a click sensation when the rotation operation of the rotation operation member is performed, is formed by fixing an annular plate member to the rotation operation member, and
   wherein a position regulating unit, which positionally regulates the annular plate member with respect to the rotation operation member, and the second end of the sheet member are located near each other.

7. The electronic apparatus according to claim 1,
   wherein the sheet member has a first end and a second end that is an end opposite to the first end, in the circumferential direction, and
   wherein the convex portion is formed in the vicinity of the first end.

8. The electronic apparatus according to claim 7,
   wherein the first end and the second end are configured by the second region, and
   wherein, in a state in which the sheet member is fixed to the circumferential surface of the rotation operation member, a gap having a width that is the same as the first region is provided between the first end and the second end.

9. The electronic apparatus according to claim 8, wherein, in the gap between the first end and the second end, the circumferential surface of the rotation operation member is exposed, and wherein, in the circumferential surface that is exposed, the surface is processed such that light is reflected to a level at which the reflected light can be detected by the detection unit.

10. The electronic apparatus according to claim 7, wherein the first end is configured by the first region, wherein the second end is configured by the second region, and wherein, in a state in which the sheet member is fixed to the circumferential surface of the rotation operation member, the second end is overlappingly fixed to the first end so as to remain the first region at the first end.

11. An image pickup apparatus comprising:
a rotation operation member having a circumferential surface;
a sheet member that is fixed to the circumferential surface of the rotation operation member; and
a detection unit provided at a position facing the sheet member and configured to apply light to the sheet member and detect light reflected from the sheet member,
wherein, in the sheet member, a first region having a first reflectance, a second region having a second reflectance that is lower than the first reflectance, and a convex portion are formed,
wherein, in the rotation operation member, a concave portion with which the convex portion can be engaged is formed, and
wherein, in the sheet member, the convex portion engages with the concave portion, and the sheet member is fixed to the circumferential surface such that the first region and the second region are alternately arranged in the circumferential direction of the circumferential surface.

* * * * *